United States Patent
Miro Panades

(10) Patent No.: US 10,090,995 B2
(45) Date of Patent: Oct. 2, 2018

(54) METHOD AND DEVICE FOR IMPROVING SYNCHRONIZATION IN A COMMUNICATIONS LINK

(71) Applicant: Commissariat á l'Energie Atomique et aux Energies Alternatives, Paris (FR)

(72) Inventor: Ivan Miro Panades, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/642,513

(22) Filed: Jul. 6, 2017

(65) Prior Publication Data

US 2018/0013545 A1   Jan. 11, 2018

(30) Foreign Application Priority Data

Jul. 6, 2016   (FR) ..................................... 16 56467

(51) Int. Cl.
*H04L 7/04*   (2006.01)
*H04L 1/00*   (2006.01)
(Continued)

(52) U.S. Cl.
CPC ............ *H04L 7/048* (2013.01); *G01R 31/317* (2013.01); *G01R 31/31937* (2013.01);
(Continued)

(58) Field of Classification Search
CPC ..... H04L 7/033; H04L 7/0008; H04L 7/0004; H04L 27/01; H04L 7/0087; H04L 7/0037; H04L 1/0036

USPC .......................... 375/326, 355–356, 371–376
See application file for complete search history.

(56) References Cited

U.S. PATENT DOCUMENTS

| | | | | |
|---|---|---|---|---|
| 6,150,863 A | * | 11/2000 | Conn ..................... | H03K 5/133 327/270 |
| 7,034,596 B2 | * | 4/2006 | Andrews ............... | H03L 7/0814 327/257 |

(Continued)

FOREIGN PATENT DOCUMENTS

| | | |
|---|---|---|
| FR | 2810479 A1 | 12/2001 |
| FR | 2944620 A1 | 10/2010 |
| WO | 2015118145 A1 | 8/2015 |

OTHER PUBLICATIONS

Preliminary Seach Report in French Patent Application No. 1656467 dated Mar. 21, 2017, 2 pages.

*Primary Examiner* — Emmanuel Bayard
(74) *Attorney, Agent, or Firm* — Moreno IP Law LLC

(57) ABSTRACT

A data reception device comprises: a first data input for receiving a first data signal and a clock input for receiving a clock signal; and a stability detection circuit adapted to generate: a first error signal indicating when a data transition of the first data signal occurs during a first period at least partially before a first significant clock edge of the clock signal; and a second error signal indicating when a data transition of the first data signal occurs during a second period at least partially after the first significant clock edge of the clock signal; and a control circuit configured to generate a control signal for adjusting the sampling time of the first data signal based on said first and second error signals.

11 Claims, 5 Drawing Sheets

(51) Int. Cl.
*H04L 7/00* (2006.01)
*G01R 31/317* (2006.01)
*H04B 1/10* (2006.01)
*G01R 31/3193* (2006.01)

(52) U.S. Cl.
CPC ............ *H04B 1/10* (2013.01); *H04L 1/0002* (2013.01); *H04L 1/0027* (2013.01); *H04L 1/0036* (2013.01); *H04L 7/0037* (2013.01); *H04L 7/0087* (2013.01)

(56) References Cited

U.S. PATENT DOCUMENTS

| | | | | |
|---|---|---|---|---|
| 7,535,957 B2* | 5/2009 | Ozawa | ............... | H03L 7/087 348/530 |
| 2004/0161068 A1* | 8/2004 | Zerbe | ............... | G11C 7/22 375/355 |
| 2004/0186674 A1* | 9/2004 | Hansen | ............... | H03K 5/135 702/79 |
| 2010/0169702 A1* | 7/2010 | Takeda | ............... | G06F 1/06 713/600 |
| 2011/0037505 A1* | 2/2011 | Kawamoto | ............... | H03L 7/07 327/159 |
| 2011/0182390 A1* | 7/2011 | Lin | ............... | H03L 1/022 375/371 |
| 2012/0072784 A1* | 3/2012 | Li | ............... | G06F 11/267 714/704 |
| 2012/0106689 A1* | 5/2012 | Byun | ............... | H03L 7/085 375/374 |
| 2013/0113534 A1* | 5/2013 | Wachi | ............... | H03L 7/091 327/148 |
| 2015/0333901 A1* | 11/2015 | Ozasa | ............... | H04L 7/04 375/362 |

* cited by examiner

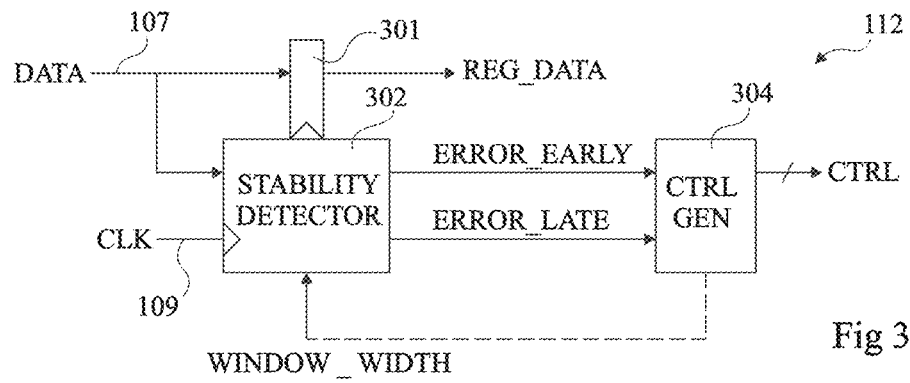
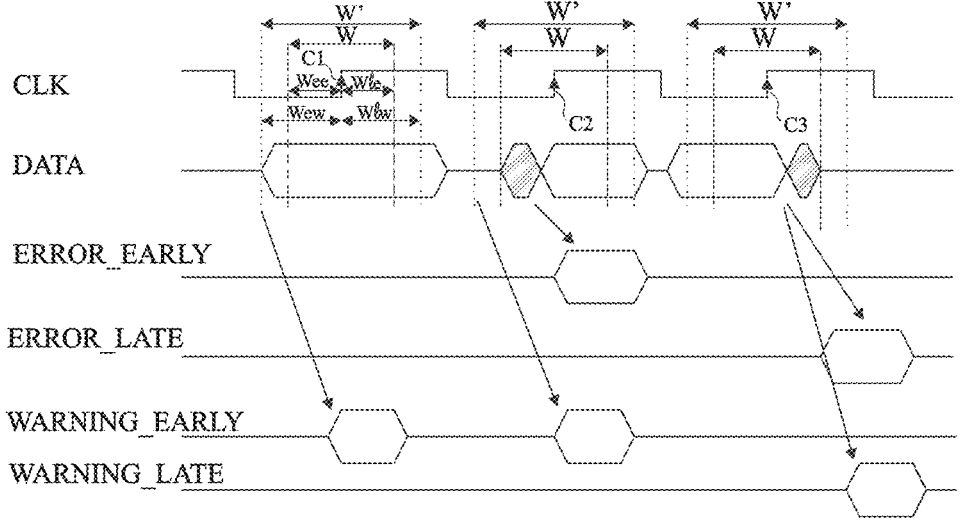
Fig 3A
Fig 3B
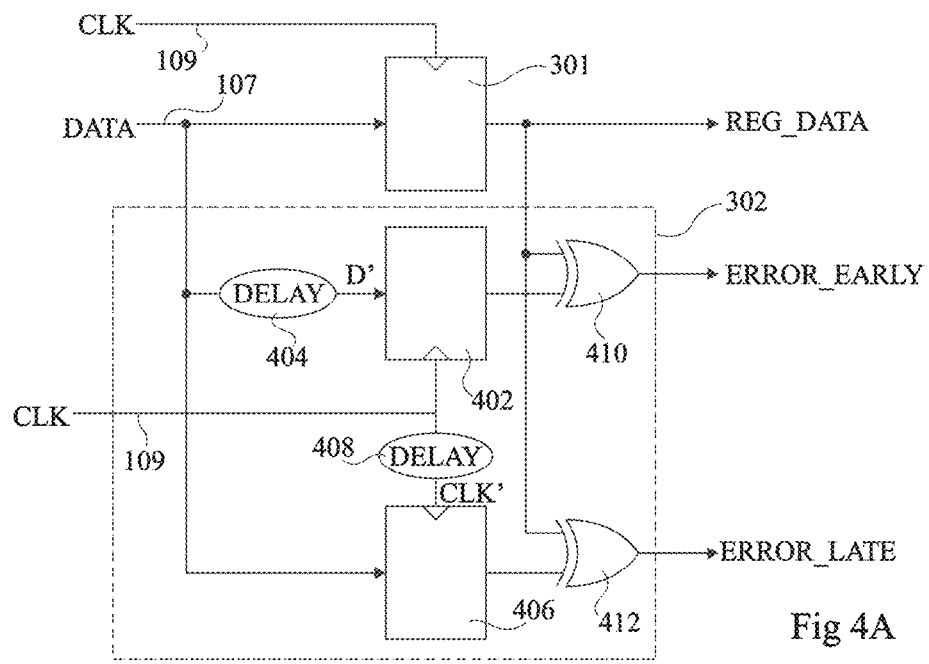
Fig 4A

METHOD AND DEVICE FOR IMPROVING SYNCHRONIZATION IN A COMMUNICATIONS LINK

FIELD

The present disclosure relates to a source-synchronous data communications link, and in particular to a method and device for adjusting a sampling time of one or more data signals transmitted over a source-synchronous communications link.

BACKGROUND

Source-synchronous communications links use a clock signal to synchronise data transmission and data reception. For example, the clock signal used for data transmission is provided over a clock line to the reception circuit such that the data reception can be based on a common clock signal. Such a solution is relatively robust against propagation delay variations over the communications link, as the propagation delays of the data streams and of the clock signal will remain substantially equal.

However, for source-synchronous links operating at relatively high data rates, the relative timing of the received clock and data signals may become non-optimal, potentially leading to an increase in the rate of data reception errors. One solution to this problem involves detecting and correcting errors in the received data signal based on error correcting code, and adjusting the relative timing of the data and clock signals in order to reduce to a minimum the error rate. However, such a solution is relatively complex and consuming in terms of chip area and power consumption. Therefore, such a solution is generally not justified for communications over relatively short distances, and/or for parallel data interfaces where the error rate of each date line needs to be considered.

There is thus a need for a simple and effective circuit and method for ensuring correct synchronization of a source-synchronous communications link.

SUMMARY

It is an aim of embodiments of the present disclosure to at least partially address one or more needs in the prior art.

According to one aspect, there is provided a data reception device comprising: a first data input for receiving a first data signal and a clock input for receiving a clock signal; and a stability detection circuit adapted to generate: a first error signal indicating when a data transition of the first data signal occurs during a first period at least partially before a first significant clock edge of the clock signal; and a second error signal indicating when a data transition of the first data signal occurs during a second period at least partially after the first significant clock edge of the clock signal; and a control circuit configured to generate a control signal for adjusting the sampling time of the first data signal based on said first and second error signals.

According to one embodiment, the stability detection circuit is configured to set the durations of the first and second periods based on a further control signal.

According to one embodiment, the control circuit is further adapted to generate the further control signal based on the first and second error signals.

According to one embodiment, the control circuit is adapted to generate the further control signal in order to reduce the widths of the first and second periods when the first and second error signals indicate the occurrence of data transitions during the first and second periods.

According to one embodiment, the control circuit is adapted to generate the control signal for controlling the duration of a time delay applied to the data signal or the clock signal, wherein the time delay is controlled in order to make the sampling time later if the first error signal is asserted and to make the sampling time earlier if the second error signal is asserted.

According to one embodiment, the stability detection circuit comprises: a first delay element adapted to delay the first data signal; a second delay element adapted to delay the clock signal; and an error signal generation circuit adapted to generate the first and second error signals based on at least the delayed first data signal and the delayed clock signal.

According to one embodiment, the stability detection circuit is further adapted to generate: a first warning signal indicating when a data transition of the data signal occurs during a third period at least partially before a first significant clock edge of the clock signal, the third period starting earlier than the first period; and a second warning signal indicating when a data transition of the data signal occurs during a fourth period at least partially after the first significant clock edge of the clock signal, the fourth period ending later than the second period.

According to one embodiment, the data reception device further comprises: a second data input for receiving a second data signal, wherein the stability detection circuit is further adapted to generate: a third error signal indicating when a data transition of the second data signal occurs during the first period leading up to a first significant clock edge of the clock signal; and a fourth error signal indicating when a data transition of the second data signal occurs during the second period starting from the first significant clock edge of the clock signal.

According to one embodiment, the first period is entirely before the first significant clock edge and the second period is entirely after the first significant clock edge.

According to one embodiment, the first period ends at the first significant clock edge and the second period starts at the first significant clock edge.

According to a further aspect, there is provided a source-synchronous data communications link comprising: the above data reception device; and a data transmission circuit adapted to generate the first data signal and the clock signal, wherein the data transmission circuit or data reception device further comprise at least one variable delay element adapted to delay the first data signal or the clock signal based on the control signal.

According to a further aspect, there is provided a method of adjusting the sampling time of a data signal transmitted over a source-synchronous data link, the method comprising: receiving a first data signal at a first data input of a data reception device of the source-synchronous data link, and a clock signal at a clock input of the data reception device; and generating, by a stability detection circuit of the data reception device: a first error signal indicating when a data transition of the first data signal occurs during a first period leading up to a first significant clock edge of the clock signal; and a second error signal indicating when a data transition of the first data signal occurs during a second period starting from the first significant clock edge of the clock signal; and generating, by a control circuit of the data reception device, a control signal for adjusting the sampling time of the data signal based on said first and second error signals.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 3A schematically illustrates a synchronous device of the data communications link of FIG. 1A in more detail according to an example embodiment of the present disclosure;

FIG. 3B is a timing diagram illustrating an example of signals in the circuit of FIG. 3A;

FIG. 4A schematically illustrates a stability detector of FIG. 3A in more detail according to an example embodiment of the present disclosure;

DETAILED DESCRIPTION OF THE PRESENT EMBODIMENTS

Throughout the following description, the term "connected" is used to designate a direct electrical connection between circuit elements, whereas the term "coupled" is used to designate a connection that may be direct, or may be via one or more intermediate elements such as resistors or capacitors. The term "around" is used to designate a range of plus or minus 10 percent of the value in question.

Figure 1A:
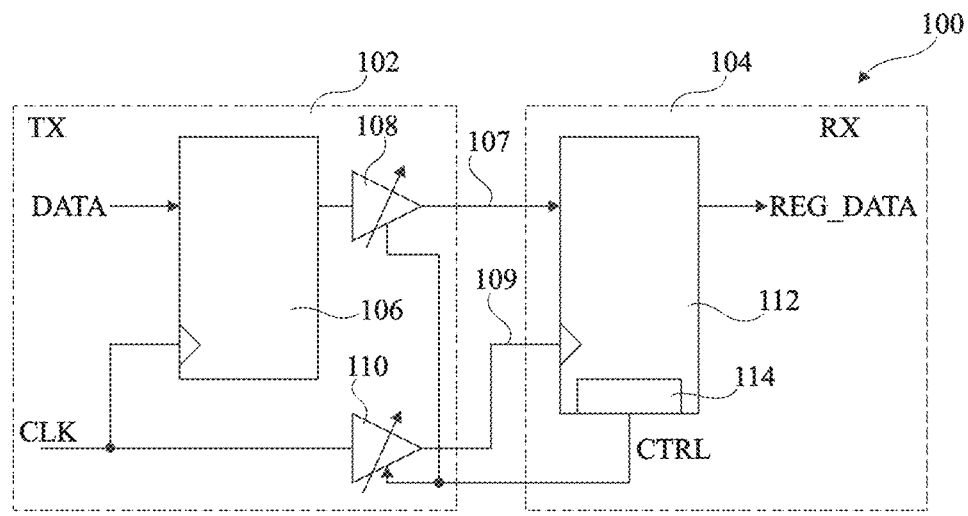
FIG. 1A schematically illustrates a source-synchronous communications link according to an example embodiment of the present disclosure.

FIG. 1A schematically illustrates a source-synchronous communications link 100 according to an example embodiment. The link 100 for example comprises a data transmission circuit (TX) 102 and a data reception circuit (RX) 104.

The transmission circuit 102 for example comprises a synchronous device 106, such as a flip-flop, receiving a data signal DATA and a clock signal CLK. The synchronous device 106 synchronizes the data signal DATA with the clock signal CLK in order to generate a signal for transmission on a data line 107 to the reception circuit 104. In some embodiments, a variable delay element 108 is coupled between the output of the synchronous device 106 and data line 107, and permits the timing of the data transitions of the data signal DATA to be adjusted. The clock signal CLK is for example transmitted over the communications link on a clock line 109, and the transmission circuit 102 for example comprises a variable delay element 110 receiving the clock signal CLK and adapted to introduce a variable delay to the clock signal CLK before its transmission on the line 109. The variable delay elements 108, 110 permit the sampling time of the data signal at the reception circuit 104 to be adjusted. In alternative embodiments, one of the variable delay elements 108 and 110 could be omitted or implemented in the reception circuit 104, or the variable delay elements 108, 110 could be replaced by other means permitting the sampling time of the data signal to be adjusted.

The reception circuit 104 for example comprises a synchronous device 112 receiving the data signal DATA on the data line 107 and the clock signal CLK on the clock line 109. The synchronous device 112 for example samples the data signal on the data line 107 based on the received clock signal CLK in order to generate a data signal REG_DATA, which is for example stored in a register (not illustrated in the figures) of the reception circuit 104. In some embodiments, the synchronous device 112 may form part of a FIFO (first-in-first-out) buffer.

The synchronous device 112 for example comprises a delay adjustment circuit 114 that detects the relative timing of data transitions of the data signal DATA with respect to timing edges of the clock signal CLK, and generates a control signal CTRL for adjusting the sampling time of the data signal DATA based on this detected relative timing. For example, the circuit 114 asserts early error signals indicating when data transitions of the data signal occur during a period leading up to a significant clock edge of the clock signal CLK, and late error signals indicating when data transitions of the data signal occur during a period starting from the first significant clock edge of the clock signal CLK. The control signal CTRL is for example generated based on these error signals. For example, the control signal causes a sampling time of the data signal to be made later in the case that the early error signal is asserted, or to be made earlier in the case that the late error signal is asserted. The control signal is for example used to control the variable delay element 108 and/or 110, although in alternative embodiments, it could cause the sampling time of the data signal DATA to be adjusted in a different fashion.

Figure 1B:
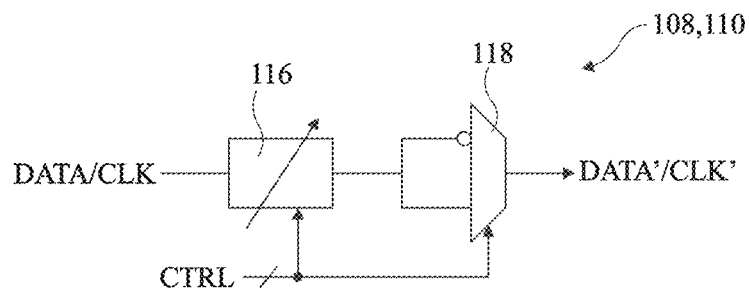
FIG. 1B schematically illustrates a delay element of the communications link of FIG. 1A in more detail according to an example embodiment of the present disclosure.

FIG. 1B schematically illustrates an example implementation of the variable delay elements 108, 110. Each element 108, 110 for example comprises a variable delay device 116, which is for example capable of delaying the data signal DATA or clock signal CLK by up to around half a period of the clock signal CLK. For example, as will be known by those skilled in the art, the variable delay device 116 is for example implemented by a chain of buffers, the number of buffers in the chain is variable and selected in a digit manner by one or more bits of the control signal CTRL. The output of the variable delay device 116 is for example coupled to both inverting and non-inverting inputs of a multiplexer 118. The multiplexer 118 is for example controlled by one or more further bits of the control signal CTRL to select the inverted or non-inverted signal to generate the delayed signal DATA' or CLK'.

Figure 1C:
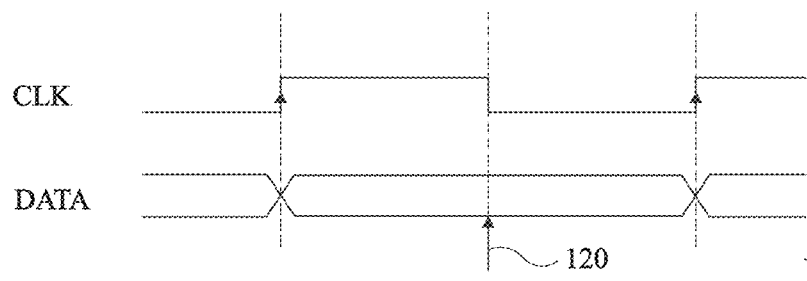
FIG. 1C is a timing diagram illustrating an example of signals in the communications link of FIG. 1A according to an example embodiment of the present disclosure.

FIG. 1C is a timing diagram illustrating an example of the signals CLK and DATA in the circuit of FIG. 1A. As illustrated, transitions in the data signal DATA are for example aligned with significant clock edges of the clock signal CLK, which in the example of FIG. 1C are rising edges. If the relative timing of the data and clock signal remains unchanged upon reception by the reception circuit 104, the intermediate clock edges, which are falling edges in the example of FIG. 1C, are for example well positioned to sample the data signal. This point is indicated by an arrow 120 in FIG. 1C.

Figure 2:
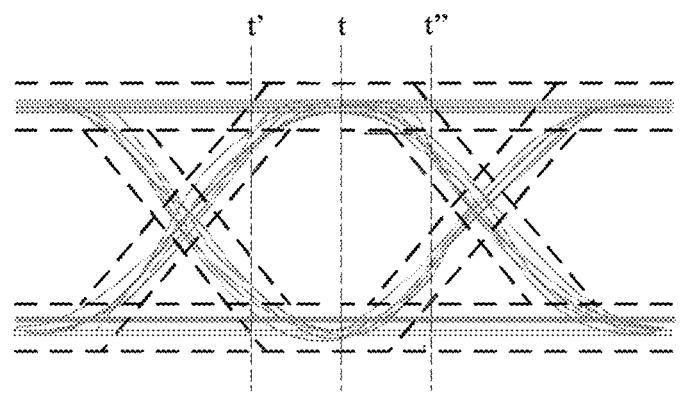
FIG. 2 is an eye diagram.

FIG. 2 is an eye diagram representing examples of the data signal as received by the reception circuit 104. The eye diagram illustrates, at a time t, examples of high and low states of the data signal DATA, along with all possible transitions before and after this high or low state. The time t is the optimal time for sampling the data signal as it is the point at which the eye of the diagram is most open, and thus the risk of an error is considerably lower than at the earlier and later times t' and t".

FIG. 3A schematically illustrates the synchronous device 112 of FIG. 1A in more detail according to an example embodiment. The device for example comprises a flip-flop 301, clocked by the clock signal CLK, and having an input coupled to the data line 107 for receiving the data signal DATA. The flip-flop provides at its output the data signal REG_DATA, which is for example stored in the register.

The delay adjustment circuit 114 for example comprises a stability detector (STABILITY DETECTOR) 302 and a control signal generator (CTRL GEN) 304. The stability detector 302 for example receives the clock signal CLK on the line 109 and data signal DATA on the line 107, and detects when a significant edge of clock signal is early or late with respect to a transition of the data signal. For example, the stability detector 302 generates an error signal ERROR_EARLY indicating when a significant clock edge arrives early, meaning that a data transition occurs during a pre-edge period leading up to the significant clock edge. The stability detector 302 also for example generates an error signal ERROR_LATE indicating when a significant clock edge arrives late, meaning that a data transition occurs during a post-edge period following the significant clock edge. Together the pre-edge and post-edge periods define a detection window. A data transition occurring during this detection window causes one or the other of the error signals to be asserted. The width of the detection window is for example equal to between a twentieth and a half of the clock period of the clock signal CLK, and for example between 10% and 20% of the clock period of this clock signal CLK. In some embodiments, the width of this window is of a fixed duration. Alternatively, the width of the window is set by a control signal WINDOW_WIDTH, which is for example generated by the circuit 304 based on the error signals. For example, the window width is reduced if both the early and late error signals ERROR_EARLY, ERROR_LATE are asserted for a same clock edge.

FIG. 3B is a timing diagram illustrating examples of the signals CLK, DATA, ERROR_EARLY, ERROR_LATE, and warning signals WARNING_EARLY, WARNING_LATE, in the stability detector 302 of FIG. 3A.

The detection windows centered on each of the significant clock edges are represented in FIG. 3B labelled W. Each detection window W for example comprises an early error window Wee used to trigger the early error signal ERROR_EARLY, and a late error window Wle used to trigger the late error signal ERROR_LATE. In the example of FIG. 3B, the early and later error windows Wee, Wle respectively end and start at the significant clock edge. However, as described below with reference to FIGS. 6A to 6G, other timing would be possible. In the example of FIG. 3B, the significant clock edges are rising edges, three rising edges C1, C2 and C3 being illustrated.

In the case of the edge C1, there is no data transition during the corresponding detection time window W, and thus neither of the early and late error signals is asserted.

In the case of the edge C2, this edge arrives early with respect to a transition of the data signal DATA, and thus this data transition occurs in the interval between the start of the window W and the edge C2. Thus the error signal ERROR_EARLY is asserted.

In the case of the edge C3, this edge arrives late with respect to a transition of the data signal DATA, and thus this data transition occurs in the interval between the edge C3 and the end of the window W. Thus the error signal ERROR_LATE is asserted.

In one embodiment, the width of the detection windows W is of around half a period of the clock signal CLK, and the windows W are centered on each significant clock edge such that the pre-edge and post-edge periods are of around the same duration as each other. As described above, the width of windows W may be variable. For example, initially, the window width may be selected to be relatively large, for example equal to around half the clock period, such that the sampling time can be adjusted with relatively high precision. The window width may then be reduced, such that one of the error signals will only be asserted in case of a relatively significant shift in the relative timing of the clock and data signals.

In some embodiments, further detection windows W' are used to generate early and late warning signals WARNING_EARLY, WARNING_LATE, which for example indicate when the sampling time of the data signal has become non-optimal, allowing a degree of correction to be applied. Like the detection windows W, the warning detection windows W' are for example centered on the significant clock edges. Similar to the error detection window W, the warning detection window W' for example comprises an early warning window Wew used to trigger the early warning signal WARNING_EARLY, and a late warning signal Wlw used to trigger the late warning signal WARNING_LATE. In the example of FIG. 3B, the early and later warning windows Wew, Wlw respectively end and start at the significant clock edge. However, as described below with reference to FIGS. 6D to 6G, other timing would be possible. In the example FIG. 3B, the early warning signal WARNING_EARLY is for example asserted for the edge C1, even though the early error signal ERROR_EARLY is not asserted, because the data transition occurs between the start of the window W' and the start of the window W. In the example of FIG. 3B the early warning signal WARNING_EARLY is also asserted for the edge C2, and the late warning signal WARNING_LATE is asserted for the edge C3.

The early and late warning signals WARNING_EARLY, WARNING_LATE are for example generated by the stability detector 302 and provided to the control signal generator 304 like the error signals. Furthermore, these warning signals are for example used to generate the control signal in the same manner as the error signals. In some embodiments, the early and late warning signals are used to provide correction of the sampling time before the error rate starts to increase significantly, and in such a case the error signals for example not only indicate that adjustment of the sampling time should be made, but also that the data is likely to be corrupted, and thus should be discarded or corrected. In alternative embodiments, the assertion of either of the warning signals may be used to make gradual adjustment to the sampling time of the data signal, whereas the assertion of either of the errors signals may be used to make more significant adjustment to the sampling time of the data signal.

FIG. 4A schematically illustrates flip-flop 301 and the stability detector 302 in more detail according to an example embodiment.

The stability detector 302 for example comprises a flip-flop 402, clocked by the clock signal CLK, and receiving a data signal D' corresponding to the data signal DATA after being delayed by a delay element (DELAY) 404. The stability detector 302 also for example comprises a further flip-flop 406, clocked by a clock signal CLK', and receiving the data signal DATA. The clock signal CLK' for example corresponds to the clock signal CLK delayed by a delay element (DELAY) 408. The output of the flip-flop 402 is for example provided to a comparator implemented by an XOR gate 410, which also receives the data signal REG_DATA, and generates the early error signal ERROR_EARLY when these signals differ. The output of the flip-flop 406 is for example provided to a comparator implemented by an XOR gate 412, which also receives the data signal REG_DATA, and generates the late error signal ERROR_LATE when these signals differ.

Operation of the circuit of FIG. 4A will now be described in more detail with reference to the timing diagram of FIG. 4B.

Figure 4B:
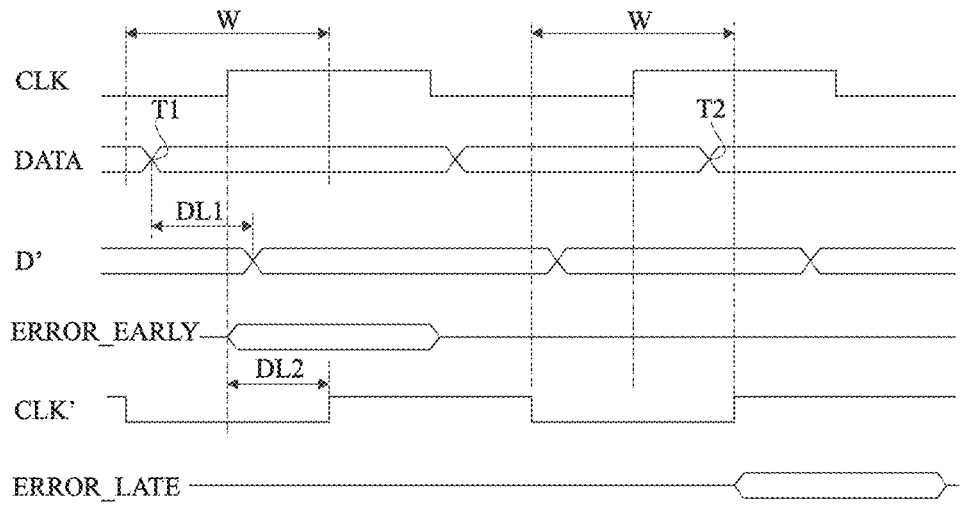
FIG. 4B is a timing diagram showing examples of signals in the stability detector of FIG. 4A according to an example embodiment.

FIG. 4B illustrates examples of the clock signal CLK, the data signal DATA, the delayed data signal D', the early error signal ERROR_EARLY, the clock signal CLK', and the late error signal ERROR_LATE.

As illustrated, the delayed data signal D' is for example delayed by the delay element 404 by a duration DL1, which in some embodiments is equal to half the duration of the window W. If the data signal DATA has a transition less than the delay value DL1 before a significant edge of the clock signal CLK, this transition will thus be delayed to occur just after this significant clock edge, as shown in FIG. 4B for the transition T1. This implies that the data signal DATA and the delayed data signal D' will have different values on a rising edge of clock signal CLK, and thus the output of the XOR gate 410 of FIG. 4A will rise, causing the error signal ERROR_EARLY to be asserted.

The clock signal CLK' is for example delayed by the delay element 408 by a duration DL2, which is also for example equal to half the width of the window W. If a data transition of the data signal DATA occurs between a significant edge of the clock signal CLK and the delayed version of this edge of the signal CLK', which is the case for the transition T2, the error signal ERROR_LATE is asserted.

Figure 5A:
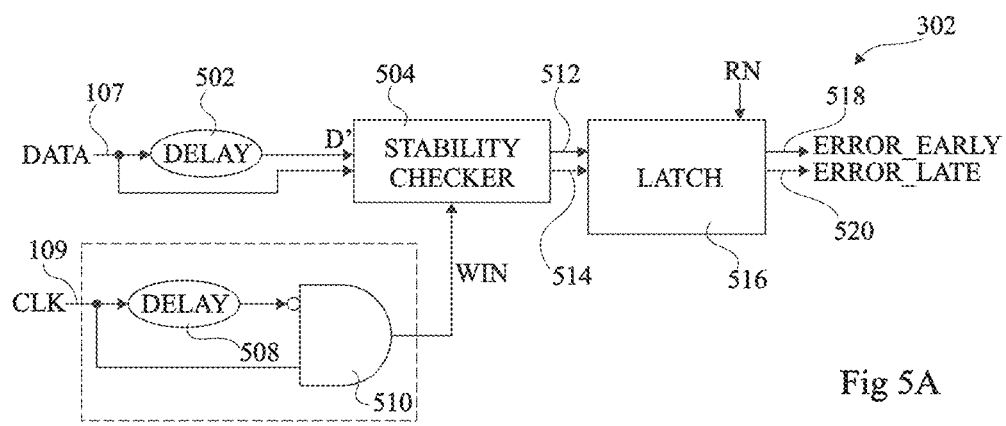
FIG. 5A schematically illustrates a stability detector of FIG. 3A in more detail according to a further example embodiment of the present disclosure.

FIG. 5A illustrates the stability detector 302 in more detail according to yet a further example embodiment.

The circuit 302 in this example for example comprises a delay element (DELAY) 502 coupled to the data line 107 and generating a delayed data signal D'. The data signal D and the data signal D' are both for example provided to a stability checker (STABILITY CHECKER) 504. The stability checker 504 also receives, from a pulse generator 506, a signal WIN. The signal WIN for example comprising a high pulse on each significant edge of a clock signal CLK. For example, the pulse generator 506 comprises a delay element (DELAY) 508 coupled to the clock line 109, and having its output coupled to an inverted input of an AND gate 510. The other non-inverted input of AND gate 510 is for example coupled to the clock line 109.

The stability checker 504 is for example adapted to activate a signal on its output line 512 when a transition of the data signal D' occurs during the high pulse of the signal WIN, and a signal on an output line 514 when a transition of the data signal D occurs during the high pulse of the signal WIN. The output lines 512 and 514 are for example coupled to a latch circuit 516, which stores an activated state of the signals on the lines 512 and 514 and provides these signals on its output lines 518, 520 respectively, until a reset signal RN is asserted. For example, the line 518 provides the early error signal ERROR_EARLY, and the line 520 provides the late error signal ERROR_LATE. The latch circuit 516 for example comprises a first latch having its data input coupled to a high state and its clock input coupled to the line 512, and a further latch having its data input coupled to a high state and its clock input coupled to the line 514.

Operation of the circuit of FIG. 5A will now be described in more detail with reference to FIG. 5B.

Figure 5B:
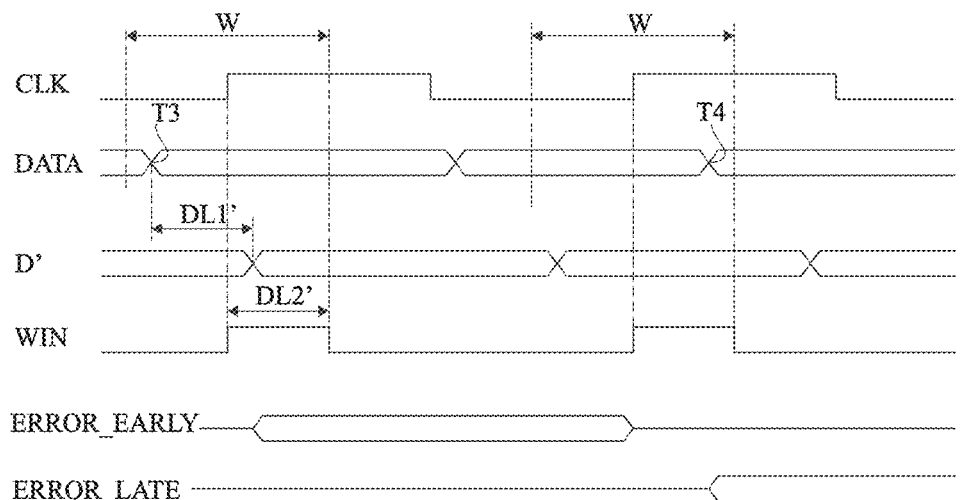
FIG. 5B is a timing diagram illustrating an example of signals in the stability detector of FIG. 5A according to an example embodiment.

FIG. 5B is a timing diagram illustrating examples of the clock signal CLK, the data signal D, the data signal D', the pulse signal WIN and the error signals ERROR_EARLY and ERROR_LATE in the circuit of FIG. 5A.

As illustrated, the delayed data signal D' is for example delayed by the delay element 502 by a duration DL1', which in some embodiments is equal to half the duration of the window W. If the data signal has a transition less than the delay value DL1 before a significant edge of the clock signal CLK, this transition will thus be delayed to occur just after this significant clock edge, as shown in FIG. 5B for a data transition T3. This transition will thus occur during a high pulse of the signal WIN, which for example has a duration DL2' introduced by the delay element 508, also for example equal to half the duration of the window W. Thus the stability checker 504 will assert the signal on the line 512, and the early error signal ERROR_EARLY will be asserted by the latch circuit 516.

Similarly, if a transition of the data signal D occurs within a window W and after a significant clock edge, it will also occur during a high pulse of the signal WIN. This is for example the case for a transition T4 of FIG. 5B. Thus the stability checker 504 will assert the signal on the line 514, and the late error signal ERROR_LATE will be asserted by the latch circuit 516.

FIGS. 6A to 6G are timing diagrams illustrating examples of early and late error windows and early and late warning windows.

Figure 6A:
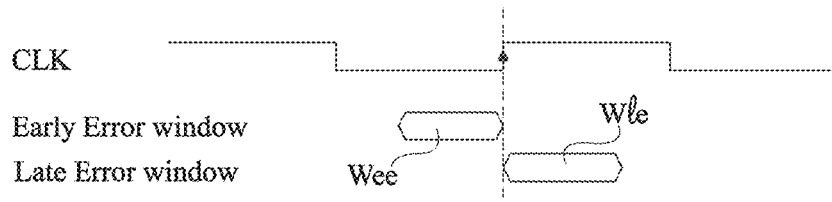
FIGS. 6A to 6G are timing diagrams illustrating examples of early and late error windows and early and late warning windows according to example embodiments of the present disclosure.

FIG. 6A illustrates an example in which the early error window Wee ends at the significant clock edge of the clock signal CLK, and the late error window Wle starts at the significant clock edge.

Figure 6B:
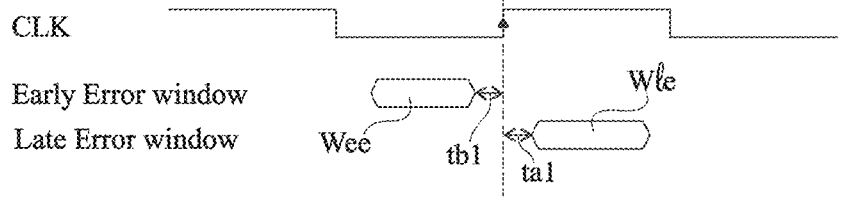

FIG. 6B illustrates an example in which the early error window Wee ends a time interval tb1 before the significant clock edge of the clock signal CLK, and the late error window Wle starts a time interval ta1 after the significant clock edge. Error signals are thus not generated if a data transition occurs during the time periods tb1 and ta1, but in practise such a transition is not likely without there first being one or several transitions during one of the windows Wee or Wle.

Figure 6C:
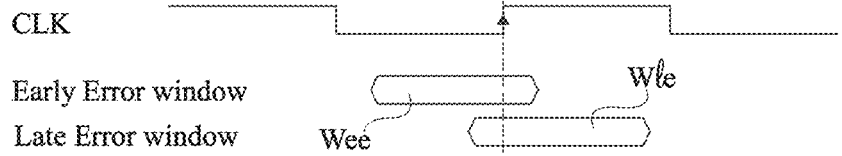

FIG. 6C illustrates an example in which the early error window Wee starts before and ends after the significant clock edge of the clock signal CLK, and the late error window Wle starts before and ends after the significant clock edge. The early error window Wee starts before the late error window Wle. The overlap between the windows Wee, Wle means that, for certain data transitions, both the early and late error signals will be asserted.

Figure 6D:
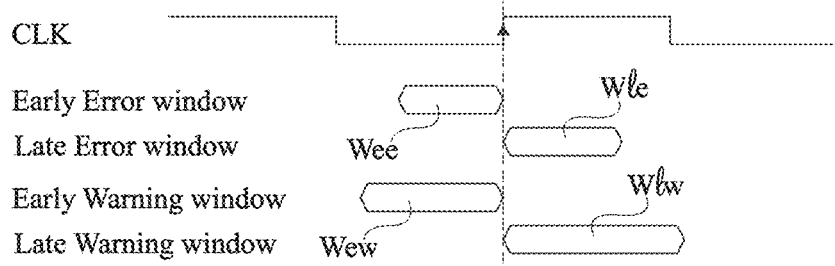

FIG. 6D illustrates an example in which the early and late error windows Wee, Wle are the same as the windows of FIG. 6A. FIG. 6D also illustrate an example of the early and late warning windows Wew, Wlw. In the example of FIG. 6D, the window Wew ends at the significant clock edge of the clock signal CLK, and the window Wlw starts at the significant clock edge.

Figure 6E:
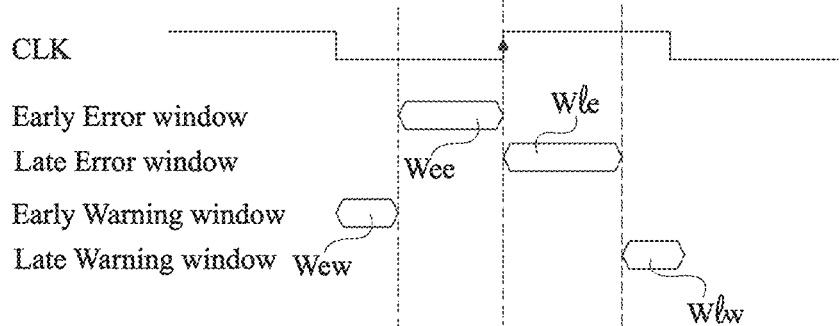

FIG. 6E illustrates an example in which the early and late error windows Wee, Wle are the same as the windows of FIG. 6A. However, the early warning window Wew starts before the start of the window Wee and ends at the start of the window Wee, and the late warning window Wlw starts at the end of the window Wle and ends after the end of the window Wle. Thus in this example error signals and warning signals will not be asserted concurrently for a same data transition.

Figure 6F:
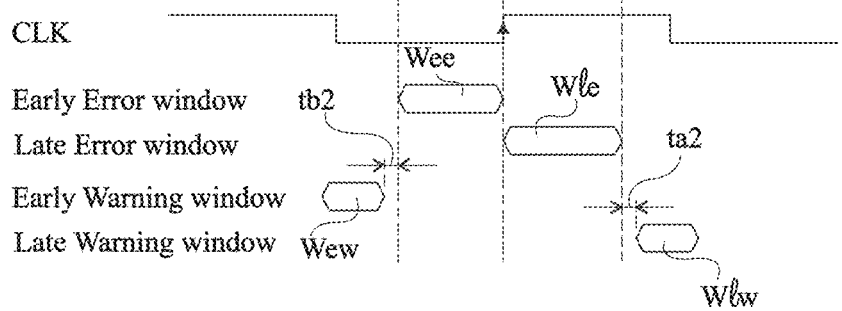

FIG. 6F illustrates an example in which the early and late error windows Wee, Wle are the same as the windows of FIG. 6A. However, the early warning window Wew starts before the start of the window Wee and ends a time interval tb2 before the start of the window Wee. The late warning window Wlw starts a time interval ta2 after the end of the window Wle.

Figure 6G:
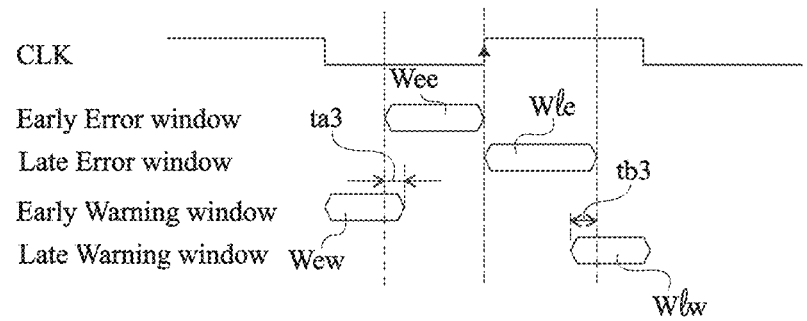

FIG. 6G illustrates an example in which the early and late error windows Wee, Wle are the same as the windows of FIG. 6A. However, the early warning window Wew starts before the start of the window Wee and ends a time interval ta3 after the start of the window Wee. The late warning window Wlw starts a time interval tb3 before the end of the window Wle, and ends after the end of the window Wle. Thus for data transitions occurring during the time intervals ta3 and tb3, both error and warning signals will be asserted.

It will be apparent to those skilled in the art that the timing of the windows Wee and Wle represented in FIGS. 6B and 6C could be applied to the examples of FIGS. 6D to 6G.

Figure 7:
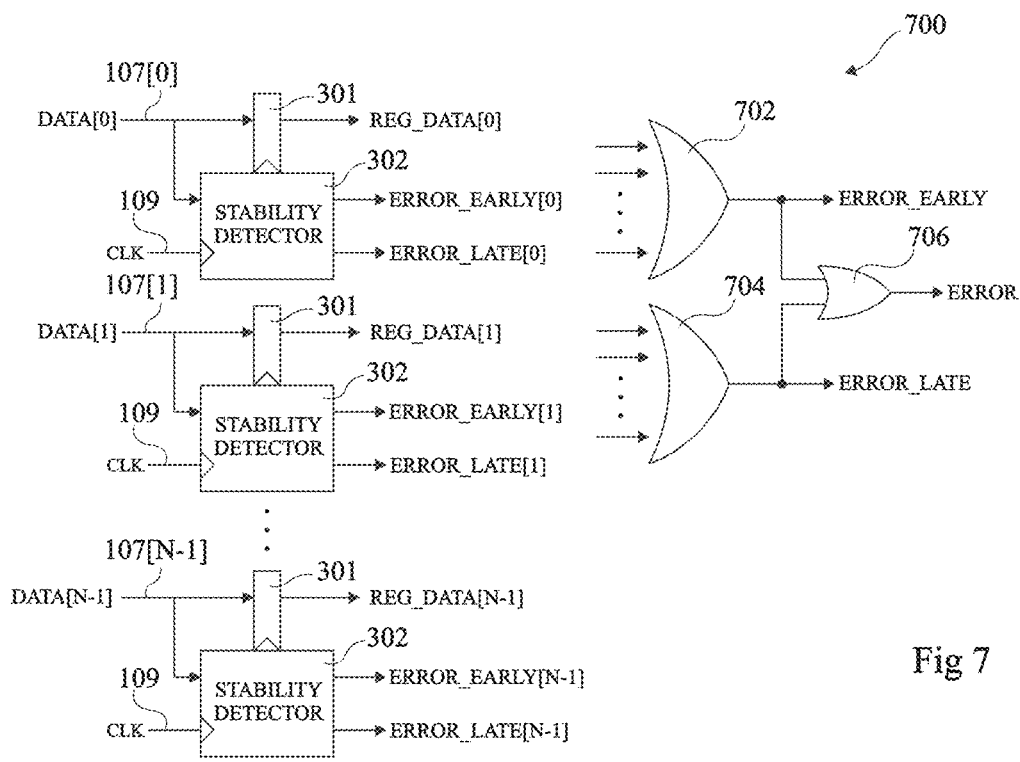
FIG. 7 schematically illustrates part of the data reception circuit of FIG. 1A adapted to receive a plurality of data signals according to an example embodiment of the present disclosure.

FIG. 7 schematically illustrates a part 700 of a reception circuit 104 of FIG. 1A in the case that there are a plurality N of data lines 107[0] to 107[N-1] respectively receiving data signals DATA[0] to DATA[N-1], wherein N is for example equal to 2 or more. Each of these data signals is provided to a corresponding flip-flop 301 generating corresponding data signals REG_DATA[0] to REG_DATA[N-1], and to a corresponding stability detector (STABILITY DETECTOR) 302 generating corresponding early and late error signals ERROR_EARLY[0] to ERROR_EARLY[N-1], and ERROR_LATE[0] to ERROR_LATE[N-1].

In some embodiments, each pair of error signals may be provided to a corresponding control signal generator 304 (not illustrated in FIG. 7) in a similar manner to the embodiment of FIG. 3A. In such a case, each data line for example comprises a circuit for adjusting its sampling time based on the corresponding control signal, such as a delay element 108.

Alternatively, the early error signals from the stability detectors 302 are for example provided to corresponding inputs of an OR gate 702, which generates a common early error signal ERROR_EARLY for the received data signals, and the late error signals from the stability detectors 302 are for example provided to corresponding inputs of an OR gate 704, which generates a common late error signal ERROR_LATE for the received data signals. A single control signal generator 304 is for example then used to adjust the sampling time of all data signals together, for example by adjusting the timing of the clock signal CLK using the delay element 110.

In some embodiments, a further OR gate 706 provides the OR function of the common error signals ERROR_EARLY and ERROR_LATE to generate an error signal ERROR indicating when at least one of the error signals is active, and thus calibration is needed.

Figure 8:
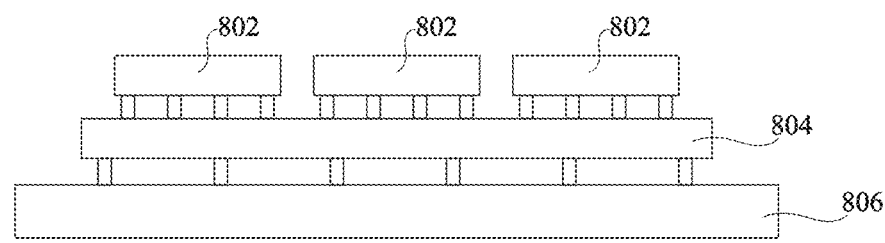
FIG. 8 is a cross-section view of a 3D circuit according to an example embodiment.

FIG. 8 is a cross-section view of a 3D circuit 800 according to an example embodiment.

The circuit for example comprises chiplets 802, three of which are illustrated in the example of FIG. 8. Each chiplet 802 is for example mounted on an interposer 804, which provides active or passive buffering between the chiplets, and for example implements the communications link described herein. The interposer 804 is for example mounted on a package 806.

In alternative embodiments, the communications link described herein could be applied to other applications, such as to communications interfaces within a same integrated circuit, between circuits of an NoC (Network-On-Chip), or to interconnect several NoCs.

An advantage of the embodiments described herein is that the synchronisation of one or more data signals with respect to a clock signal transmitted over a data communications link can be adjusted in a simple manner, with a relatively compact circuit. Indeed, the stability detector described herein is a relatively simple circuit which can be added to the synchronous reception device of each data signal in a reception circuit.

Having thus described at least one illustrative embodiment, various alterations, modifications and improvements will readily occur to those skilled in the art. For example, it will be apparent to those skilled in the art that, while example implementations of the stability detector have been described in relation with FIGS. 4A and 5A, these are merely examples, and other implementations would be possible.

Furthermore, it will be apparent to those skilled in the art that the various features described in relation with the various embodiments could be combined, in alternative embodiments, in any combination. For example, the adjustable window width described in relation with FIG. 3A could be implemented in the embodiment of FIG. 7.

What is claimed is:

1. A data reception device for a source-synchronous data communications link, comprising:
    a first data input for receiving a first data signal and a clock input for receiving a clock signal, the first data signal and clock signal being received from a data transmission circuit; and
    a stability detection circuit adapted to generate:
    a first error signal indicating when a data transition of the first data signal occurs during a first period at least partially before a first significant clock edge of the clock signal; and
    a second error signal indicating when a data transition of the first data signal occurs during a second period at least partially after the first significant clock edge of the clock signal; and
    a control circuit configured to generate a control signal for controlling the duration of a time delay applied to the data signal or to the clock signal by the data transmission circuit or data reception device, wherein the time delay is controlled in order to make a sampling time of said first data signal later if the first error signal is asserted and to make the sampling time of said first data signal earlier if the second error signal is asserted.

2. The data reception device of claim 1, wherein the stability detection circuit is configured to set the durations of the first and second periods based on a further control signal.

3. The data reception device of claim 2, wherein the control circuit is further adapted to generate the further control signal based on the first and second error signals.

4. The data reception device of claim 3, wherein the control circuit is adapted to generate the further control signal in order to reduce the widths of the first and second periods when the first and second error signals indicate the occurrence of data transitions during the first and second periods.

5. The data reception device of claim 1, wherein the stability detection circuit comprises:
a first delay element adapted to delay the first data signal;
a second delay element adapted to delay the clock signal; and
an error signal generation circuit adapted to generate the first and second error signals based on at least the delayed first data signal and the delayed clock signal.

6. The data reception device of claim 1, wherein the stability detection circuit is further adapted to generate:
a first warning signal indicating when a data transition of the data signal occurs during a third period at least partially before a first significant clock edge of the clock signal, the third period starting earlier than the first period; and
a second warning signal indicating when a data transition of the data signal occurs during a fourth period at least partially after the first significant clock edge of the clock signal, the fourth period ending later than the second period.

7. The data reception device of claim 1, further comprising:
a second data input for receiving a second data signal, wherein the stability detection circuit is further adapted to generate:
a third error signal indicating when a data transition of the second data signal occurs during the first period leading up to a first significant clock edge of the clock signal; and
a fourth error signal indicating when a data transition of the second data signal occurs during the second period starting from the first significant clock edge of the clock signal.

8. The data reception device of claim 1, wherein the first period is entirely before the first significant clock edge and the second period is entirely after the first significant clock edge.

9. The data reception device of claim 1, wherein the first period ends at the first significant clock edge and the second period starts at the first significant clock edge.

10. A source-synchronous data communications link comprising:
the data reception device of claim 1; and
a data transmission circuit adapted to generate the first data signal and the clock signal, wherein the data transmission circuit or data reception device further comprise at least one variable delay element adapted to delay the first data signal or the clock signal based on the control signal.

11. A method of adjusting the sampling time of a data signal transmitted over a source-synchronous data link, the method comprising:
receiving, from a data transmission circuit, a first data signal at a first data input of a data reception device of the source-synchronous data link, and a clock signal at a clock input of the data reception device; and
generating, by a stability detection circuit of the data reception device:
a first error signal indicating when a data transition of the first data signal occurs during a first period at least partially before a first significant clock edge of the clock signal; and
a second error signal indicating when a data transition of the first data signal occurs during a second period at least partially after the first significant clock edge of the clock signal; and
generating, by a control circuit of the data reception device, a control signal for controlling the duration of a time delay applied to the data signal or to the clock signal by the data transmission circuit or data reception device, wherein the time delay is controlled in order to make a sampling time of said first data signal later if the first error signal is asserted and to make the sampling time of said first data signal earlier if the second error signal is asserted.

* * * * *